United States Patent [19]

Tokiguchi et al.

[11] Patent Number: 4,633,138
[45] Date of Patent: Dec. 30, 1986

[54] ION IMPLANTER

[75] Inventors: Katsumi Tokiguchi, Machida; Osami Okada, Chofu; Noriyuki Sakudo, Ome; Hidemi Koike, Tokorozawa, all of Japan

[73] Assignee: Hitachi, Ltd., Tokyo, Japan

[21] Appl. No.: 766,393

[22] Filed: Aug. 16, 1985

[30] Foreign Application Priority Data

Sep. 10, 1984 [JP] Japan .................. 59-187900

[51] Int. Cl.⁴ .................. G21K 5/00; H01J 7/24
[52] U.S. Cl. .................. 315/111.81; 250/492.2
[58] Field of Search .................. 250/492.21, 492.22; 315/111.81

[56] References Cited

U.S. PATENT DOCUMENTS 4,410,800 10/1983 Yoshikawa .................. 250/492.22
4,421,988 12/1983 Robertson et al. .................. 250/492.21
4,574,179 3/1986 Masuzawa .................. 315/111.81

Primary Examiner—Harold Dixon
Attorney, Agent, or Firm—Antonelli, Terry & Wands

[57] ABSTRACT

In order to implant ions uniformly in a plurality of wafers, carriers, on which a plurality of wafers are mounted, are moved along a straight line one after another. An ion implanter comprises a beam sweep width controller for controlling the beam sweep width in such a manner that the area scanned with the ion beam by sweeping it coincides approximately with the shape of the wafers in which ions are to be implanted and a carrier speed controller for controlling the carrier speed, depending on the beam sweep width so that the dose of ions implanted in the wafers is uniform. The beam sweep width controller includes a detector for detecting the width of a wafer in which ions are being implanted in the one direction and a controller for varying the beam sweep width, depending on the width of the wafer thus detected. The carrier speed controller varies the carrier speed inversely proportionally to the width of the wafer thus detected.

4 Claims, 6 Drawing Figures

ION IMPLANTER

BACKGROUND OF THE INVENTION

This invention relates to an ion implanter used for the fabrication of semiconductor elements, and in particular to an ion implanter permitting to reduce the implantation time and to increase the number of treated wafers, when they are silicon wafers having a large diameter.

In the field of the fabrication process of semiconductor elements, the ion implantation method is utilized, by which impurity ions such as phosphorus, boron, arsenic, etc. are implanted for the formation of the emitter and the base of bipolar transistors or for the formation of the source and the drain of MOS transistors. FIG. 1 is a scheme illustrating the ion-implantation chamber of a high-current ion implanter, which is used at present in a production line (cf. "Semiconductor World", 1982, 8, p. 43). The diameter of wafers usually used at present is 4 inches (100 mm) or 5 inches (125 mm). 25 wafers forming one unit for semiconductor process line are mounted as a batch on the surface of a rotating disk 1. Uniform ion implantation of wafers is carried out by mechanically moving the disk 1 in a radial direction and by rotating it with respect to a stationary ion beam.

Now, in the fabrication process of semiconductor elements, the diameter of the wafers tends to be larger and larger and it is anticipated that wafers having a diameter of 6 to 10 inches will be utilized in the near future. When wafers having such a large diameter are mounted in a prior art ion-implanation chamber as illustrated in FIG. 1, only several wafers can be mounted. It is also conceivable to increase the diameter of the rotating disk 1 so that the number of mounted wafers is increased. However, this method results in an extremely large ion-implantation chamber and thus this improvement is not practical method. The maximum size of the disk, which can be practically applicable to a present implanter is about 1 m in diameter.

On the other hand, in the prior art device as illustrated in FIG. 1, the wafers can be exchanged, in general, only after the atmospheric pressure has been reestablished in the ion-implantation chamber. The time necessary for wafer exchange operation, including the evacuation operation, is at shortest from several minutes to about ten minutes. The number of wafers, which can be treated for those having a large diameter, is at most several tens of wafers per hour. That is, even if the ion beam current is increased, the time necessary for the wafer exchange and the evacuation operation is longer than that necessary for the ion-implanation itself. Therefore, the wafer throughput is limited with the time necessary for the wafer exchange and evacuation operation. Consequently, in order to increase the number of wafers, which can be treated, for those having a large diameter, various ion-implantation methods permitting to reduce the wafer exchange time and the evacuation operation time, are proposed. For example, a method is known, by which the ion beam is magnetically scanned in one direction by means of a magnetic field and at the same time the wafers are moved mechanically in the direction perpendicular to the magnetic scanning.

In this case the introduction of the wafers one by one into the ion-implantation chamber in vacuum is required. Mechanical apparatus which provides one wafer per every 10 seconds into vacuum chamber, have been already put to practical use. Wafer throughput of about 360 wafers per hour can be usually realized for wafers with a large diameter. In this case, the throughput depends on the intensity of the ion beam current. However, the prior art magnetic scanning method as described above has a drawback that the wasteful area, where ions are implanted wastefully due to beam overscanning, increases with wafer diameter increase.

FIGS. 2a and 2b are schemes for explaining the prior art uniform ion-implantation method with the magnetic scanning. The ion beam 3 is magnetically swept in a horizontal direction by means of an N pole and an S pole, as indicated in FIG. 2a. Wafers 2 are moved mechanically e.g. downward. Usually the amplitude of the ion beam scan is kept constant and the velocity of the mechanical movement of the wafers 2 is also kept constant. The velocity of this mechanical movement depends on the magnitude of the ion beam current and the ion dose. However, by such a prior art method, ions were implanted also in the hatched region in FIG. 2b. In general, the area of this region is compatible with wafer area. In particular, when the wafer diameter is large, this wasteful area is also large. For example, Japanese Utility Model Unexamined Publication Nos. 57-182864 (1982) and 58-79948 (1983) can be cited as prior art techniques relating to this sort of ion implanter in which a magnetic type beam scanner is used.

SUMMARY OF THE INVENTION

The object of this invention is to resolve the problems mentioned above in the prior art techniques and is to provide an apparatus permitting to reduce the wastefully ion-implanted area. The third object is to realize uniform ion-implantation with a high speed and a high efficiency corresponding to the requirements of the wafer diameter increase.

An ion implanter according to this invention, in which the ion beam is scanned in one direction by means of a beam scanner and a carrier, on which a plurality of wafers are mounted along at least one row, is moved in the direction substantially perpendicular to the beam scanning direction along a straight line so that ions are implanted uniformly in each of the wafers, is characterized in that it comprises further a beam sweep width control means for controlling the beam sweep width in such a manner that the beam-scanned area coincides substantially with the shape of the wafers in which ions are to be implanted and a carrier speed control means for controlling the carrier speed, depending on the beam sweep width so that the uniform implantation of the wafers is realized.

Concretely speaking, a detector for detecting the wafer position with respect to the beam is disposed and the beam sweep width is varied, depending on the position signal thus obtained, by varying the magnetic field intensity. In addition, the mechanical drive speed of the carrier is varied at the same time in such a manner that the ion-implantation dose is uniform on the wafers. This speed control is especially required since the mean current density passing through the wafers varies in this invention, even if the ion-implantation beam current is constant.

BRIEF DESCRIPTION OF THE DRAWINGS

In FIGS. 2a and 2b, the ion beam is magnetically swept in one direction and wafers are moved in the direction substantially perpendicular to magnetic scan;

DESCRIPTION OF THE PREFERRED EMBODIMENTS

Figure 1:
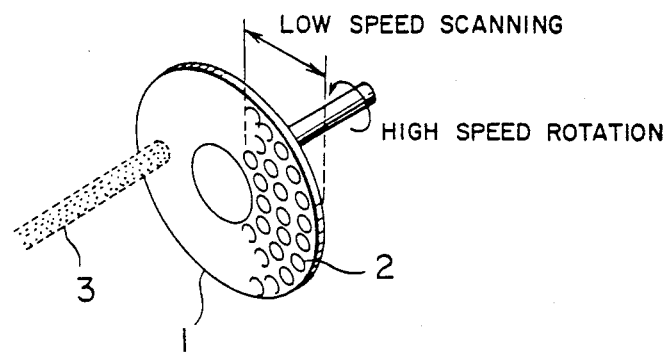
FIG. 1 is a perspective view of a prior art ion implanter using a rotating disk.
Figure 2A:
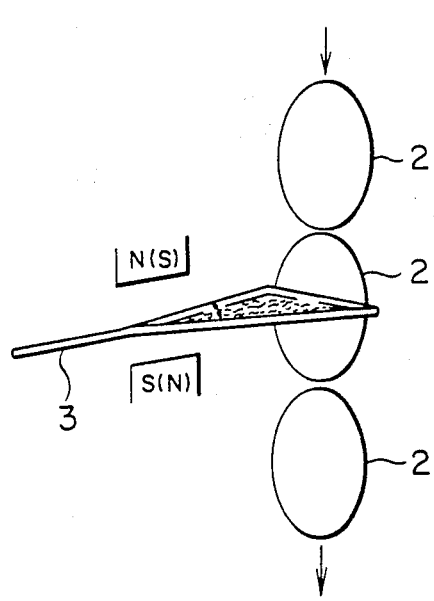
FIGS. 2a and 2b are respectively a perspective and a plan view for explaining the prior art uniform ion-implantation method.
Figure 2B:
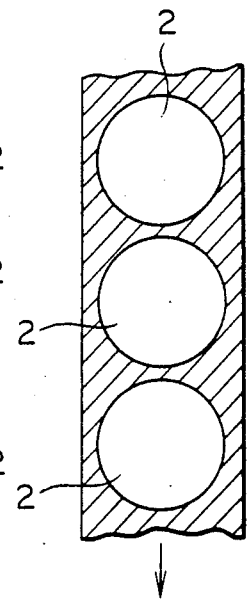
Figure 3:
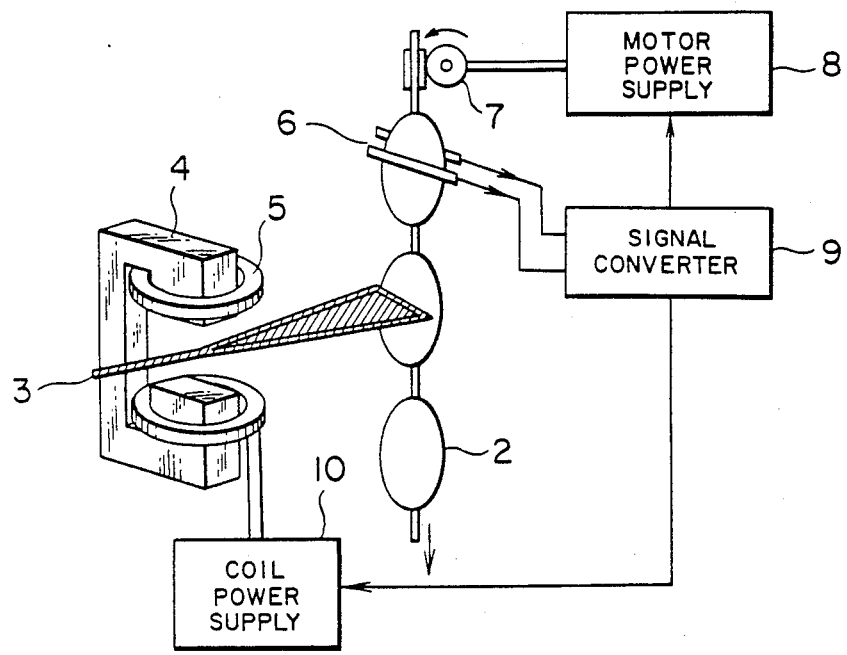
FIG. 3 is a scheme showing the total construction of an ion implanter according to an embodiment of this invention.
Figure 4:
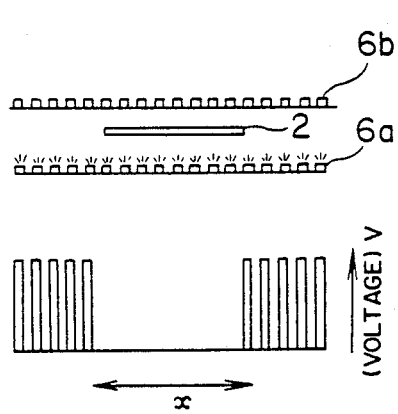
FIG. 4 shows sensors arrayed on line used in the ion implanter shown in FIG. 3 and an example of its output signals.
Figure 5:
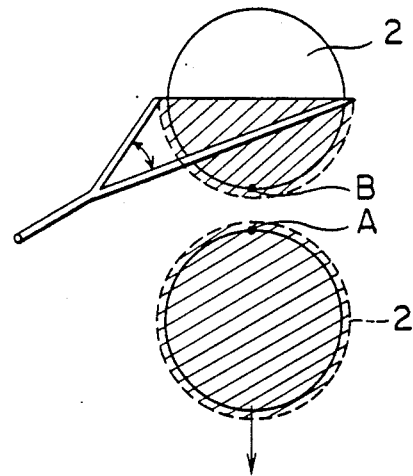
FIG. 5 indicates an ion beam irradiation region, in the case where ions are implanted using the ion implanter shown in FIG. 3.

Hereinbelow an embodiment of this invention will be explained, referring to FIGS. 3 to 5. FIG. 3 is a scheme showing the total construction of an ion implanter according to one embodiment of this invention, in which the reference numeral 2 indicates wafers; 3 is the ion beam; 4 is a magnetic circuit made of magnetic materials; 5 indicates excitation coils; 6 is sensors arrayed on line; 7 is a driving motor; 8 is a motor power supply; 9 is a signal converter; and 10 is a coil power supply. The sensors 6 arrayed on line are mounted on the course of the wafer array moved with the driving motor 7 along a straight line. The position, at which the sensors 6 are mounted, is so selected that the positional relationship between the sensors 6 position and the wafer position is relatively identical to that between the scanning beam position and the wafer position. That is, when the ion beam is swept along the line passing through the center of a wafer, the sensors are arrayed also on the line passing through the center of another wafer. FIG. 4 shows the sensors 6 arrayed on line in detail and electrical output signals. The sensors 6 are composed of light emitting diodes 6a having a small diameter and photosensitive elements 6b disposed so that each of them corresponds to each of the diodes, both of them being arranged along a line respectively in the lateral direction. X represents the length, where one of the wafers 2 is shielding photosensitive elements 6b in the lateral direction. Depending on this x, signal voltages indicated in FIG. 4 are obtained. The length x, where no output electrical signals do appear, varies with the movement of the wafers. In this embodiment a signal converter 9 is employed to transform this quantity x into an electric signal. The signal generating by this signal converter 9 is fed back to the coil power supply 10. This power supply 10 controls the triangular magnetic field intensity so as to coincide the beam sweep width on the wafer with x. In this embodiment the magnetic field intensity is changed by varying the excitation coil current.

In the case of this embodiment, the change of the beam sweep width results in the variation of ion current density implanted into the wafer. For this reason, if the wafers were moved mechanically with a constant speed along a straight line, variations in ion-implantation dose in the straight drive direction would be considerably large. Consequently the straight drive speed should be varied inversely proportionally to the sweep width x. In this embodiment the speed is controlled by inputting signals from the signal converter 9 to the motor power supply 8, which is used as the power source for driving the motor 7 to accomplish the straight drive of the wafers. That is, in this embodiment, the beam sweep width controller is composed of the signal converter 9 generating electric signals corresponding to the width of the wafers and the coil power supply 10 controlling the excitation current flowing in the excitation coils 5 so that the width of the irradiation with the beam determined by the beam sweep is identical to that of the wafers, and the carrier speed controller is composed of the signal converter 9, the motor power supply 8 and the motor 7 driven by it. The beam irradiation region with respect to the wafer 2, when ion-implantation is carried out by means of the apparatus according to this embodiment, is indicated by hatching in FIG. 5. The circle indicated with a broken line in FIG. 5 corresponds to an overscanning region for ensuring the ion-implantation dose at the peripheral portion of the wafer. The circle diameter indicated with a broken line is a little larger than that of the wafer at that time. From the time point when the ion-implantation at the point A, which is the top portion of the wafer, terminates to that when the ion-implantation at the point B, which is the lowest part of the next wafer, begins, the mechanical straight drive speed is kept constant, which equals to the straight drive speed at the moment of the irradiation at the point A.

Following concrete numerical values can be cited as an example. A triangular magnetic field having a frequency of about 8 Hz was generated by using the magnetic circuit 4 and the excitation coil 5 and phosphorus ions (P+) implantation was carried out. As a result, it was confirmed that the number of treated wafers having a diameter greater than 5 inches was increased by more than 20%.

According to this invention, since the beam irradiation region is limited to the portion of wafers in an apparatus, in which ions are uniformly implanted into wafers having a large diameter by sweeping the beam by means of a magnetic field, the area, where ions are implanted wastefully, is reduced. Therefore, a remarkable merit can be obtained in the increase of the wafer throughput.

Furthermore, the invention has been explained in the above stated embodiment supposing that the carrier drive speed is so controlled that ions are implanted uniformly. It is clear that the uniform ion implantation is possible also by maintaining this drive speed constant and varying the ion-implantation beam current. In addition, it is clear that the same effect can be obtained by constructing the apparatus so that the speed of a belt or a chain transporting the whole carrier, on which the wafers are mounted, is kept constant and that only the wafers are moved in the drive direction of the carrier with respect to the belt or the chain. Further, although, in the above stated embodiment, the position of the wafers is detected by means of sensors arrayed on line and the beam sweep width and the carrier drive speed are controlled, depending on the position of the wafers thus detected, this invention is not restricted to the construction of this embodiment. That is, it is clear that the same effect can be also obtained by operating the implanter so that a detection signal of the wafer position by means of a light emitting diode and a photosensitive element is used as a start signal. In this case, after the implanter begins to operate, the beam sweep width and the carrier speed are controlled according to a program previously memorized in a microcomputer. Still further, although this invention has been explained in the embodiment, supposing that the wafers are circular, this invention can be applied also to wafers having various shapes other than circles.

We claim:

1. An ion implanter, in which the ion beam is swept in one direction by means of a beam scanner and a carrier, on which a plurality of wafers are mounted along at least one row, is moved in the direction substantially perpendicular to the scanning with the beam along a straight line so that ions are implanted uniformly into each of the wafers, comprising:
- a beam sweep width control means for controlling the beam sweep width in such a manner that the area scanned with the ion beam by sweeping it coincides substantially with the shape of the wafers in which ions are to be implanted; and
- a carrier speed control means for controlling the carrier speed, depending on the beam sweep width so that the dose of ions implanted in the wafers is uniform.

2. An ion implanter according to claim 1, wherein said beam sweep width control means consists of a detector for detecting the width of a wafer, in which ions are being implanted in said one direction, and a control means for varying the beam sweep width by varying the magnetic field intensity of said magnetic type beam scanner, depending on the width of the wafer thus detected.

3. An ion implanter according to claim 2, wherein said carrier speed control means is a speed control means for varying the carrier speed inversely proportionally to the width of the wafer thus detected.

4. An ion implanter according to claim 2, wherein said detector consists of light emitting diodes and photosensitive elements receiving light emitted by said light emitting diodes.

* * * * *